United States Patent
Shigematsu et al.

(12) 
(10) Patent No.: US 7,468,309 B2
(45) Date of Patent: Dec. 23, 2008

(54) SEMICONDUCTOR WAFER TREATMENT METHOD

(75) Inventors: Koichi Shigematsu, Tokyo (JP); Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 456 days.

(21) Appl. No.: 11/390,339

(22) Filed: Mar. 28, 2006

(65) Prior Publication Data

US 2006/0223285 A1 Oct. 5, 2006

(30) Foreign Application Priority Data

Mar. 29, 2005 (JP) .............................. 2005-095196

(51) Int. Cl.
*H01L 21/00* (2006.01)
(52) U.S. Cl. .............................. 438/462; 257/E21.599; 438/15

(58) Field of Classification Search .................... 438/15, 438/17, 113, 462
See application file for complete search history.

(56) References Cited

U.S. PATENT DOCUMENTS
7,390,681 B1 * 6/2008 Tristan ........................ 438/15

FOREIGN PATENT DOCUMENTS
JP 2002-118081 4/2002

* cited by examiner

*Primary Examiner*—David A Zarneke
(74) *Attorney, Agent, or Firm*—Smith, Gambrell & Russell, LLP

(57) ABSTRACT

A semiconductor wafer treatment method for dividing an adhesive tape, which has been stuck to the entire back of a semiconductor wafer, along divided streets of the semiconductor wafer. Before division of the adhesive tape by application of laser beams, the state of the divided streets is detected, and laser beams are applied to the adhesive tape based on such detection.

4 Claims, 4 Drawing Sheets

SEMICONDUCTOR WAFER TREATMENT METHOD

FIELD OF THE INVENTION

This invention relates to a semiconductor wafer treatment method which comprises dividing a semiconductor wafer along streets arranged thereon in a lattice pattern, sticking an adhesive tape to the entire back of the wafer, and then dividing the adhesive tape along the divided streets.

DESCRIPTION OF THE PRIOR ART

Japanese Patent Application Laid-Open No. 2002-118081 discloses a method of treating a wafer which has a plurality of rectangular regions partitioned on the face thereof by streets arranged in a lattice pattern on this face, and has semiconductor devices disposed in these rectangular regions. This method comprises forming grooves of a predetermined depth in the face of the wafer along the streets, then sticking a protective tape to the face of the wafer, then grinding the back of the wafer to render the thickness of the wafer substantially the same as the predetermined depth, thereby dividing the wafer along the streets, then sticking an adhesive tape to the entire back of the wafer, and then dividing the adhesive tape along the divided streets. The division of the adhesive tape can be performed by applying laser beams to the adhesive tape along the divided streets. Each of the rectangular regions, which have been separated individually and have the adhesive tape stuck to the back thereof, is released from the protective tape, and mounted on a die via the adhesive tape.

However, the semiconductor wafer treatment method disclosed in Japanese Patent Application Laid-Open No. 2002-118081 involves the following problems: According to the inventors' experience, when the back of the wafer is ground to divide the wafer along the streets, thereby separating the rectangular regions individually, each of the rectangular regions is somewhat displaced, although its face is stuck to the common protective tape. As a result, the divided street existent between the individual rectangular regions becomes somewhat distorted from its initial straightly extending state, and does not form a straight line any more. Nevertheless, the conventional semiconductor wafer treatment method is designed to apply a laser beam to the adhesive tape, thereby dividing the adhesive tape, on the assumption that the divided streets extend straightly. According to the conventional semiconductor wafer treatment method, therefore, a laser beam for dividing the adhesive tape may be applied to the rectangular region where the semiconductor device is disposed, rather than to the region of the divided street, with the result that the semiconductor device may be damaged.

SUMMARY OF THE INVENTION

It is a principal object of the present invention, therefore, to provide a novel and improved semiconductor wafer treatment method which can divide the adhesive tape along the divided street, without damaging the rectangular region by applying a laser beam to the rectangular region.

The inventors noted that the divided street present between the individual rectangular regions became somewhat distorted from its initial straightly extending state, and did not form a straight line any more. In the light of this fact, the inventors tried to detect the state of the divided street before performing the division of the adhesive tape by applying a laser beam to the adhesive tape, and apply a laser beam to the adhesive tape based on this detection. By so doing, the inventors have found that the above-mentioned principal object can be attained.

According to the present invention, there is provided, as a semiconductor wafer treatment method for attaining the above principal object, a semiconductor wafer treatment method for a semiconductor wafer having a plurality of rectangular regions partitioned on the face of the wafer by streets arranged in a lattice pattern on the face, comprising dividing the wafer along the streets, sticking an adhesive tape to an entire back of the wafer, and then dividing the adhesive tape along the streets which have been divided, the semiconductor wafer treatment method further comprising detecting the state of the divided streets before dividing the adhesive tape along the divided streets, and performing the division of the adhesive tape by applying laser beams to the adhesive tape based on the detection of the state of the divided streets.

Preferably, the detection of the state of the divided streets involves detecting, on the divided streets, the xy-coordinate positions of at least 3 points spaced from each other in the extending direction of the streets. Preferably, based on the coordinate positions of the 3 points, a linear functional line is calculated by the method of least-squares, the inclination angle of the linear functional line is calculated, and the amounts of displacement, in a y-axis direction, of the 3 points with respect to the linear functional line are calculated when the linear functional line has been modified to extend parallel to an x-axis direction. On the divided streets, it is preferred to apply a laser beam to the adhesive tape along a straight line connecting one end of the linear functional line to the point of the 3 points nearest to the one end, thereby dividing the adhesive tape; then apply a laser beam along a straight line connecting the nearest point to the point of the 3 points second nearest to the one end, thereby dividing the adhesive tape; then apply a laser beam along a straight line connecting the second nearest point to the point of the 3 points third nearest to the one end, thereby dividing the adhesive tape; and then apply a laser beam along a straight line connecting the third nearest point to the other end of the linear functional line, thereby dividing the adhesive tape. In a preferred embodiment, the grooves of a predetermined depth d are formed in the face of the wafer along the streets, then a protective tape is stuck to the face of the wafer, then the back of the wafer is ground to render the thickness of the wafer substantially the same as the predetermined depth d, whereby the wafer is divided by the streets, and then the adhesive tape is stuck to the back of the wafer.

With the semiconductor wafer treatment method of the present invention, the state of the divided streets is detected, and laser beams are applied to the adhesive tape based on such detection. Thus, damage caused to the rectangular region by application of the laser beam to the rectangular region can be reliably avoided.

DETAILED DESCRIPTION OF THE PREFERRED EMBODIMENTS

The preferred embodiments of the semiconductor wafer treatment method constituted in accordance with the present invention will now be described in detail with reference to the accompanying drawings.

Figure 1:
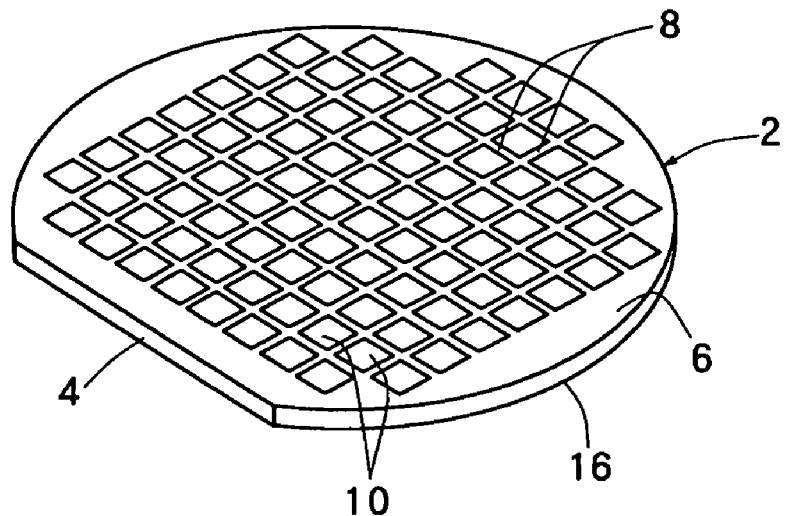
FIG. 1 is a perspective view showing a typical example of a semiconductor wafer to which the semiconductor wafer treatment method of the present invention can be applied.

FIG. 1 shows a typical example of a semiconductor wafer to which the semiconductor wafer treatment method of the present invention can be applied. A wafer entirely indicated at the numeral 2, which is formed from a suitable material such as silicon, is in the shape of a disk, except a straight-line edge 4 called an orientation flat. On the face 6 of the wafer 2, a plurality of rectangular regions 10 are partitioned by streets 8 arranged in a lattice pattern. A semiconductor device is disposed in each of the rectangular regions 10.

Figure 2:
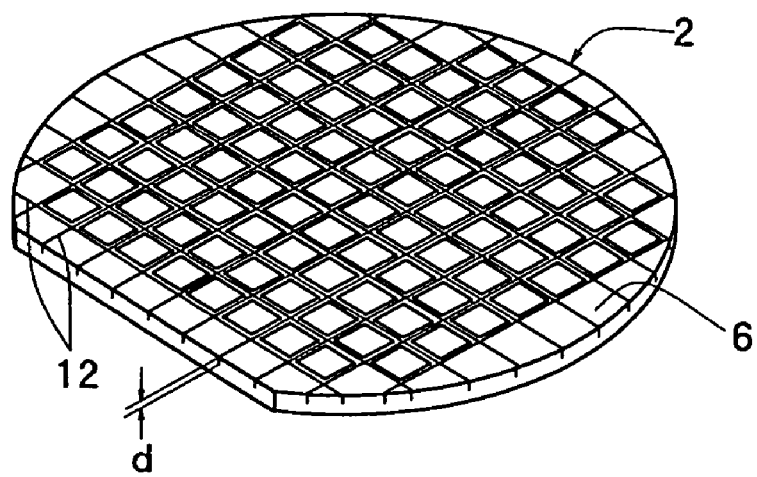
FIG. 2 is a perspective view showing the wafer of FIG. 1 having grooves formed in the face of the wafer along streets.

In a preferred embodiment of the semiconductor wafer treatment method according to the present invention, a groove 12 of a predetermined depth d is formed in the face 6 of the wafer 2 along each of the streets 8, as shown in FIG. 2. Such a groove 12 can be formed by cutting the face 6 of the wafer 2 to the depth d along each of the streets 8 by, for example, a thin ring-shaped cutting blade (not shown) containing diamond grains.

Figure 3:
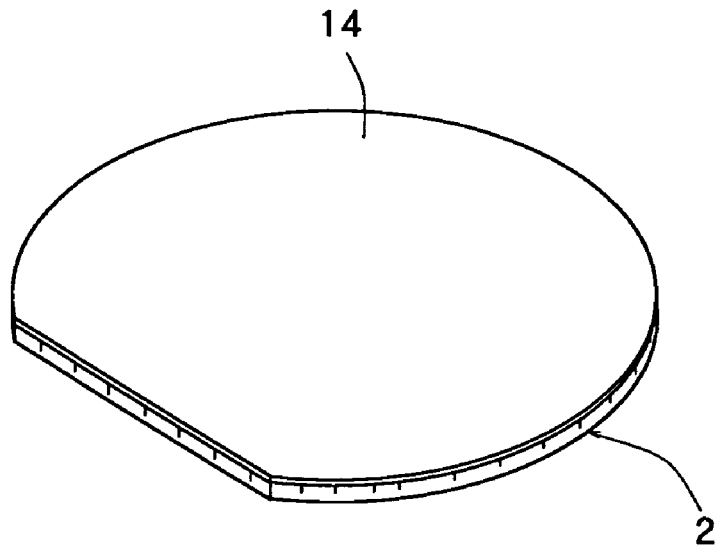
FIG. 3 is a perspective view showing the wafer of FIG. 2 having a protective tape stuck to the face of the wafer.
Figure 4:
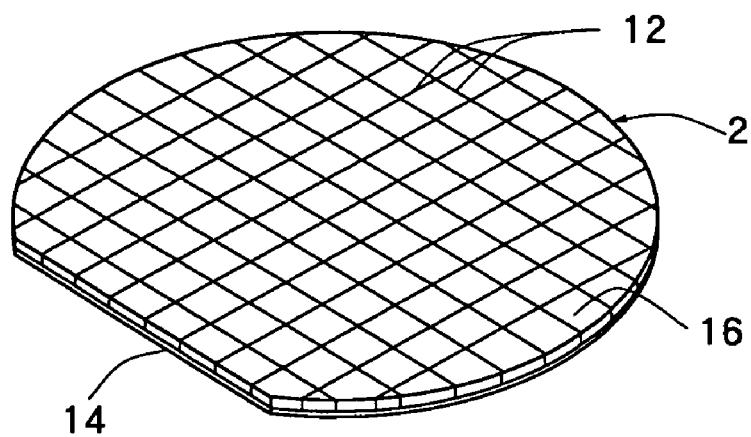
FIG. 4 is a perspective view showing the wafer of FIG. 3 turned upside down, with the back of the wafer being ground to divide the wafer along the streets, thereby separating rectangular regions individually.

Then, as shown in FIG. 3, a protective tape 14, which can be composed of a suitable synthetic film or sheet, is stuck onto the face 6 of the wafer 2. Then, as shown in FIG. 4, the back 16 of the wafer 2 is ground to render the thickness of the wafer 2 substantially the same as the depth d of the groove 12, whereby the wafer 2 is divided along each of the streets 8 to separate the rectangular regions 10 individually. Grinding of the back 16 of the wafer 2 can be performed by holding on a rotating chuck (not shown) the wafer 2 having the protective tape 14 stuck to the face 6, with the wafer 2 being turned upside down, and causing a rotating grinding wheel (not shown), which has a grinding member containing diamond grains, to act on the exposed back of the wafer 2, thereby carrying out grinding.

Figure 5:
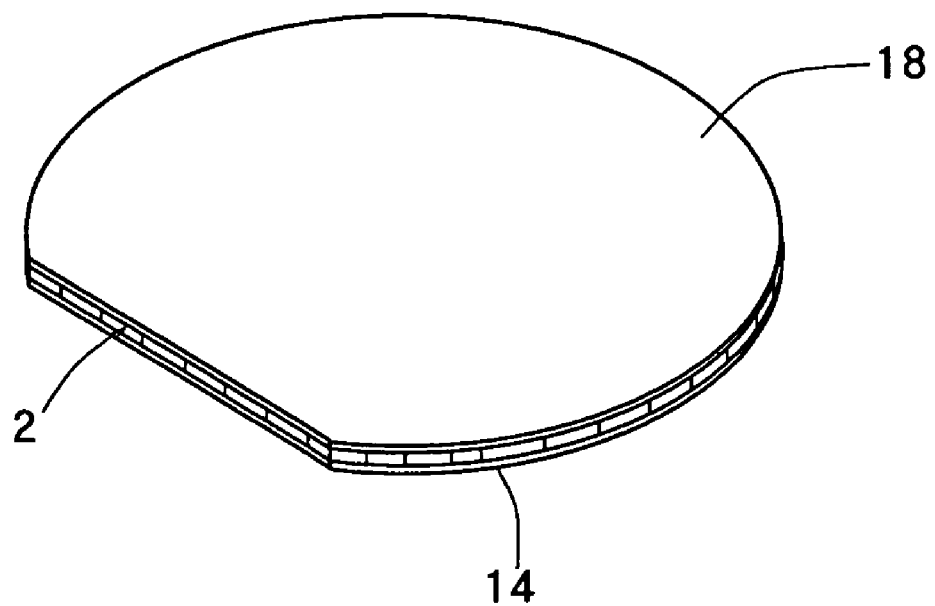
FIG. 5 is a perspective view showing the wafer of FIG. 3 turned upside down, with an adhesive tape being stuck to the back of the wafer in FIG. 4.

Then, as shown in FIG. 5, an adhesive tape 18 is stuck to the whole of the back 16 of the wafer 2, namely, all of the backs of the rectangular regions 10 separated individually. The adhesive tape 18, called a die attach film, can be formed from a polyimide, epoxy or acrylic film or sheet.

Figure 6:
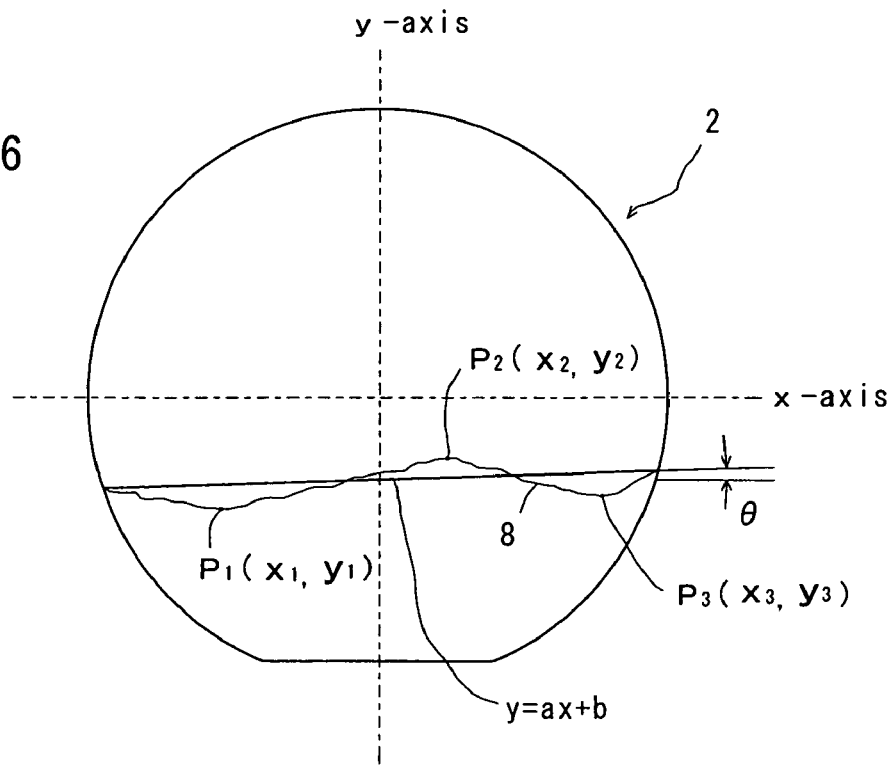
FIG. 6 is a schematic view showing the distortion of one divided street in an exaggerated manner.
Figure 7:
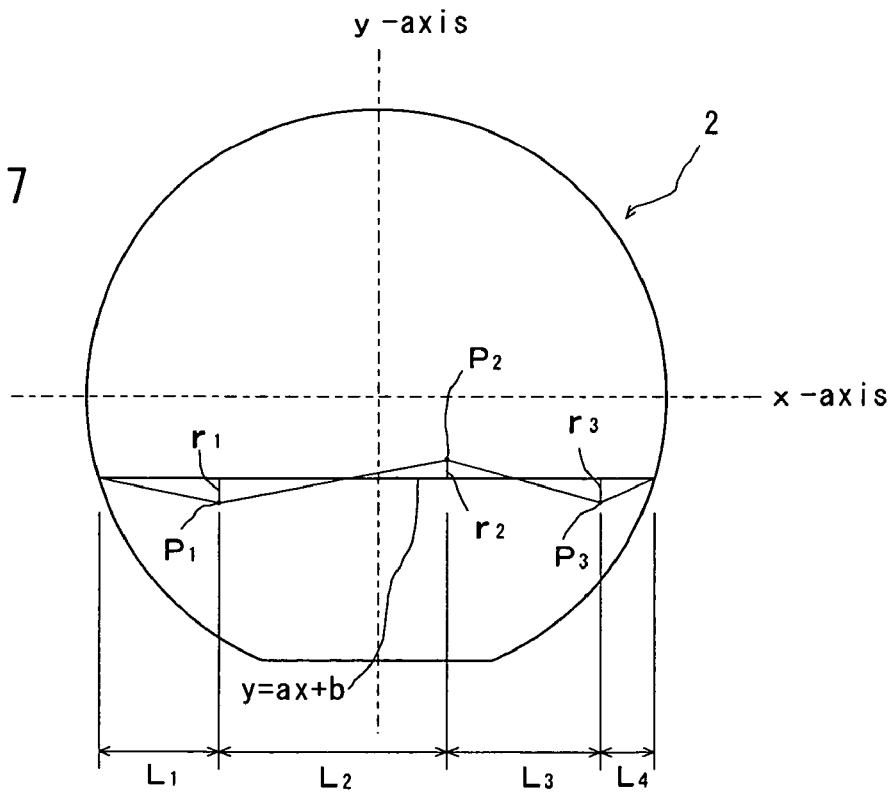
FIG. 7 is a schematic view showing an example of the loci of laser beams applied, with the inclination angle of a linear functional line of the one divided street being corrected so as to be parallel to an x-axis.

In the semiconductor wafer treatment method of the present invention, it is important that after the adhesive tape 18 is stuck to the back 16 of the wafer 2, the state of the divided streets 8 be detected before laser beams are applied to the adhesive tape 18. An explanation will be offered by reference to FIG. 6 illustrating one of the divided streets 8 schematically and with exaggeration of distortion. In detecting the state of the divided street 8, the back 16 of the wafer 2 is imaged through a microscope annexed to a laser beam applicator (not shown). Then, on the divided street 8 observed through the adhesive tape 18, detection is performed of the xy-coordinate positions $(x_1, y_1)$, $(x_2, y_2)$ and $(X_3, y_3)$, in the microscope, of at least 3 points, $P_1$, $P_2$ and $P_3$, spaced from each other in the extending direction of the street 8. Then, based on these xy-coordinate positions, a linear functional line y=ax+b for the divided street 8 is calculated by the method of least-squares. The inclination angle $\theta$=tan−a, with respect to the x-axis, of this linear functional line is calculated. Then, as shown in FIG. 7, the chuck (not shown), on which the wafer 2 has been held, is rotated by $\theta$ to put the linear functional line y=ax+b into a state extending parallel to the x-axis.

Then, the amounts of displacement, in the y-axis direction, of the above 3 points, $P_1$, $P_2$ and $P_3$, with respect to the above linear functional line y=ax+b, which extends parallel to the x-axis, are calculated as follows:

$$\gamma_1 = x_1 \sin\theta - y_1 \cos\theta + b'$$

$$\gamma_2 = x_2 \sin\theta - y_2 \cos\theta + b'$$

$$\gamma_3 = x_3 \sin\theta - y_3 \cos\theta + b'$$

where b'=b cos $\theta$

Based on the state of the divided street 8, which has been detected in the above-described manner, laser beams are applied to the adhesive tape 18, with the relative movement loci of the laser beams with respect to the wafer 2 being controlled as appropriate, whereby the adhesive tape 18 is divided. The laser beams can be thrown from the back side of the wafer 2 so as to be applied to the adhesive tape 18. Alternatively, the laser beams can be thrown from the face side of the wafer 2 and passed through the divided street 8 so as to be applied to the adhesive tape 18.

A preferred mode of controlling the relative movement foci of laser beam will be described with reference to FIG. 7. In a region $L_1$, a laser beam is applied along a straight line connecting one end of the linear functional line y=ax+b to the point $P_1$ (of the 3 points, the point nearest to the one end of the linear functional line), accordingly, with the laser beam being relatively moved while its direction is corrected in the y-axis direction in accordance with the following equation $$y' = (\gamma_1/L_1) \times x$$

in correspondence with its movement in the x-axis direction. Then, in a region $L_2$, a laser beam is applied along a straight line connecting the point $P_1$ to the point $P_2$ (of the 3 points, the point second nearest to the one end of the linear functional line), accordingly, with the laser beam being relatively moved while its direction is corrected in the y-axis direction in accordance with the following equation $$y' = ((\gamma_2 - \gamma_1)/L_2) \times x + \gamma_1$$

in correspondence with its movement in the x-axis direction. Then, in a region $L_3$, a laser beam is applied along a straight line connecting the point $P_2$ to the point $P_3$ (of the 3 points, the point third nearest to the one end of the linear functional line), accordingly, with the laser beam being relatively moved while its direction is corrected in the y-axis direction in accordance with the following equation $$y' = ((\gamma_3 - \gamma_2)/L_3) \times x + \gamma_2$$

in correspondence with its movement in the x-axis direction. Then, in a region $L_4$, a laser beam is applied along a straight line connecting the point $P_3$ to the other end of the linear functional line y=ax+b, accordingly, with the laser beam being relatively moved while its direction is corrected in the y-axis direction in accordance with the following equation $$y'=(-\gamma_3/L_4)\times x+\gamma_3$$

in correspondence with its movement in the x-axis direction.

Preferably, the detection of the state of the divided street 8 is performed individually for all of the streets 8, and the relative movement loci of laser beams are controlled in accordance with such detections. However, if the distortions of the divided streets 8 have characteristics in common, to a certain extent, for example, it is possible, if desired, to detect the states of several particular streets 8 in connection with the streets 8 extending in the x-axis direction in FIG. 7, and control the relative movement of laser beams on the assumption that the streets 8 whose state detection has been omitted are in the same state as the state of one street 8 whose state has been detected. Similarly, in connection with the streets 8 extending in the y-axis direction in FIG. 7, it is possible, if desired, to rotate the wafer 2 through 90 degrees, then detect the states of several particular streets 8, and control the relative movement of laser beams on the assumption that the streets 8 whose state detection has been omitted are in the same state as the state of one street 8 whose state has been detected.

While the preferred embodiments of the semiconductor wafer treatment method constituted according to the present invention have been described in detail by reference to the accompanying drawings, it is to be understood that the invention is not limited to such embodiments, but various changes and modifications may be made without departing from the scope of the invention.

What we claim is:

1. A semiconductor wafer treatment method for a semiconductor wafer having a plurality of rectangular regions partitioned on a face of the wafer by streets arranged in a lattice pattern on the face, comprising dividing the wafer along the streets, sticking an adhesive tape to an entire back of the wafer, and then dividing the adhesive tape along the streets which have been divided, the semiconductor wafer treatment method further comprising:

detecting a state of the divided streets before dividing the adhesive tape along the divided streets wherein the detection of the state of the divided streets involves detecting, on the divided streets, xy-coordinate positions of at least 3 points spaced from each other in an extending direction of the streets; and performing division of the adhesive tape by applying laser beams to the adhesive tape based on detection of the state of the divided streets.

2. The semiconductor wafer treatment method according to claim 1, wherein the detection of the state of the divided streets involves:

calculating a linear functional line by a method of least-squares based on the coordinate positions of the 3 points;

calculating an inclination angle of the linear functional line; and calculating amounts of displacement, in a y-axis direction, of the 3 points with respect to the linear functional line when the linear functional line has been modified to extend parallel to an x-axis direction.

3. The semiconductor wafer treatment method according to claim 1, further comprising, on the divided streets:

applying a laser beam to the adhesive tape along a straight line connecting one end of the linear functional line to the point of the 3 points nearest to the one end, thereby dividing the adhesive tape;

then applying a laser beam along a straight line connecting the nearest point to the point of the 3 points second nearest to the one end, thereby dividing the adhesive tape;

then applying a laser beam along a straight line connecting the second nearest point to the point of the 3 points third nearest to the one end, thereby dividing the adhesive tape; and then applying a laser beam along a straight line connecting the third nearest point to an opposite end of the linear functional line, thereby dividing the adhesive tape.

4. The semiconductor wafer treatment method according to claim 1, further comprising:

forming grooves of a predetermined depth d in the face of the wafer along the streets;

then sticking a protective tape to the face of the wafer;

then grinding the back of the wafer to render a thickness of the wafer substantially identical with the predetermined depth d, thereby dividing the wafer along the streets; and then sticking the adhesive tape to the back of the wafer.

* * * * *